US012610748B2

(12) United States Patent
Dutta et al.

(10) Patent No.: US 12,610,748 B2
(45) Date of Patent: Apr. 21, 2026

(54) SELECTIVE ENCAPSULATION FOR METAL ELECTRODES OF EMBEDDED MEMORY DEVICES

(71) Applicant: International Business Machines Corporation, Armonk, NY (US)

(72) Inventors: Ashim Dutta, Menands, NY (US); Ekmini Anuja De Silva, Slingerlands, NY (US); Jennifer Church, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 18/455,815

(22) Filed: Aug. 25, 2023

(65) Prior Publication Data

US 2023/0403951 A1      Dec. 14, 2023

Related U.S. Application Data

(62) Division of application No. 16/286,995, filed on Feb. 27, 2019, now Pat. No. 11,778,929.

(51) Int. Cl.
*H10N 70/00* (2023.01)
*H10B 61/00* (2023.01)
(Continued)

(52) U.S. Cl.
CPC ........... *H10N 70/011* (2023.02); *H10B 61/00* (2023.02); *H10B 63/80* (2023.02); *H10N 50/01* (2023.02); *H10N 50/80* (2023.02); *H10N 70/231* (2023.02); *H10N 70/826* (2023.02); *H10N 70/841* (2023.02)

(58) Field of Classification Search
CPC . H10N 70/841; H01L 21/02697; H10B 61/00
See application file for complete search history.

(56) References Cited

U.S. PATENT DOCUMENTS

| | | | |
|---|---|---|---|
| 7,112,861 B2 | 9/2006 | Kanakasabapathy et al. | |
| 7,449,345 B2 | 11/2008 | Horng et al. | |
| (Continued) | | | |

OTHER PUBLICATIONS

IBM Appendix P., "List of IBM Patents or Patent Applications to be Treated as Related", Dated Herewith, 2 pages.
(Continued)

*Primary Examiner* — Shih Tsun A Chou
(74) *Attorney, Agent, or Firm* — Scott Dobson

(57) ABSTRACT

A semiconductor device structure and a method for fabricating the same. The semiconductor device structure includes an embedded memory device and an electrode in contact with a top surface of the memory embedded device. A metal encapsulation layer is in contact with a top surface of the electrode and a portion of sidewalls of the electrode. The metal encapsulation layer comprises one or more materials that are chemical etch resistant and are conductive when oxidized. The method includes forming an insulating layer over a memory device and an electrode in contact with the memory device. Portions of the insulating layer are etched. The etching exposes a top surface and a portion of sidewalls of the electrode. A metal encapsulation layer is formed over and in contact with the top surface and the portion of sidewalls of the electrode.

17 Claims, 9 Drawing Sheets

(51) Int. Cl.
　　*H10B 63/00*　　　(2023.01)
　　*H10N 50/01*　　　(2023.01)
　　*H10N 50/80*　　　(2023.01)
　　*H10N 70/20*　　　(2023.01)

(56)　　　　　　　References Cited

U.S. PATENT DOCUMENTS

| | | |
|---|---|---|
| 9,343,659 B1 | 5/2016 | Lu et al. |
| 9,515,252 B1 | 12/2016 | Annunziata et al. |
| 10,002,904 B2 | 6/2018 | Annunziata et al. |
| 11,778,929 B2 | 10/2023 | Dutta |
| 2006/0148234 A1* | 7/2006 | Chen ..................... H10N 50/01 |
| | | 438/618 |
| 2014/0061827 A1 | 3/2014 | Huang et al. |
| 2014/0199837 A1 | 7/2014 | Hung et al. |
| 2015/0299848 A1 | 10/2015 | Haukka et al. |
| 2016/0133828 A1* | 5/2016 | Lu .......................... H10N 50/01 |
| | | 257/421 |
| 2017/0323803 A1 | 11/2017 | van Schravendijk et al. |
| 2018/0175284 A1 | 6/2018 | Hsieh et al. |
| 2018/0366638 A1 | 12/2018 | Lin et al. |

OTHER PUBLICATIONS

Son Van Nguyen et al., "Selective CVD metal deposition for nano device fabrication," 2nd Area Selective Deposition Workshop, ASD, 2017, 1 page. 2017.

C.-C. Yang et al., "Selective chemical vapor deposition-grown Ru for Cu interconnect capping applications," Electrochemical and Solid-State Letters, vol. 13, No. 5, 2010, pp. D33-D35. 2010.

* cited by examiner

SELECTIVE ENCAPSULATION FOR METAL ELECTRODES OF EMBEDDED MEMORY DEVICES

BACKGROUND OF THE INVENTION

The present disclosure generally relates to the field of semiconductors, and more particularly relates to encapsulation for metal electrodes of embedded memory devices.

Memory devices are often embedded or integrated on-chip to realize various advantages such as reduced chip number, increased response times, etc. Embedded memory devices may utilize technologies such as magnetic tunnel junctions, phase change materials, and/or the like. Components of the embedded memory devices are often susceptible to damage during subsequent processing and integration operations. For example, the top electrode of a memory device may become eroded or damaged while the memory device is being embedded in the backend of the line interconnects.

SUMMARY OF THE INVENTION

In one embodiment, a method for encapsulating an electrode of a memory device is disclosed. The method comprises forming an insulating layer over a memory device and an electrode in contact with the memory device. Portions of the insulating layer are etched. The etching exposes a top surface and a portion of sidewalls of the electrode. A metal encapsulation layer is formed over and in contact with the top surface and the portion of sidewalls of the electrode.

In another embodiment, a semiconductor device structure is disclosed. The semiconductor device structure comprises an embedded memory device and an electrode in contact with a top surface of the memory embedded device. A metal encapsulation layer is in contact with a top surface of the electrode and a portion of sidewalls of the electrode. The metal encapsulation layer comprises one or more materials that are chemical etch resistant and are conductive when oxidized.

In a further embodiment, an integrated circuit is disclosed. The integrated circuit comprises an embedded memory device and an electrode in contact with a top surface of the memory embedded device. A metal encapsulation layer is in contact with a top surface of the electrode and a portion of sidewalls of the electrode. The metal encapsulation layer comprises one or more materials that are chemical etch resistant and are conductive when oxidized.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
FIG. 1 is a cross-sectional view of a semiconductor device structure after one or more memory devices have been patterned according to one embodiment of the present invention.
Figure 1:
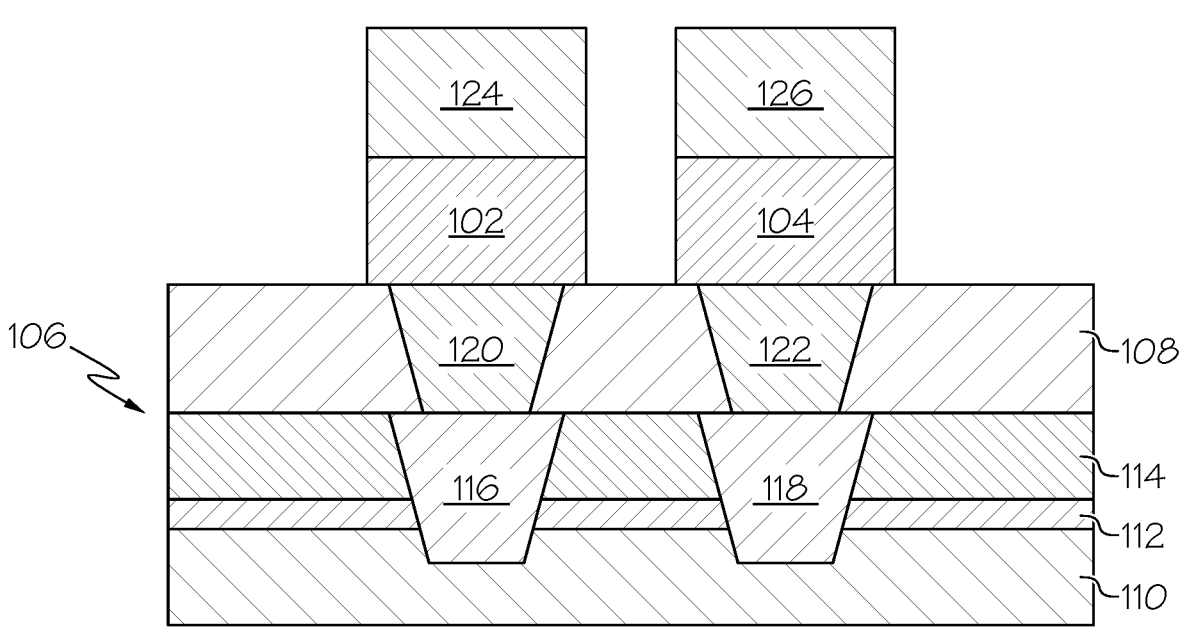

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Components of the embedded memory devices are often susceptible to damage during subsequent processing and integration operations. For example, the top electrode of a memory device may become eroded or damaged while the memory device is being embedded in the backend of the line interconnects. As will be discussed in greater detail below, embodiments of the present invention overcome these problems by encapsulating the top electrodes of an embedded memory device with a metal encapsulation layer. The metal encapsulation layer comprises one or more materials that are chemical etch resistant and that are highly conductive when oxidized.

FIGS. 1-8 illustrate various processes for selective encapsulation of metal electrodes for embedded memory devices according to various embodiments of the present invention. Embodiments of the present invention are directed to a point in the fabrication process after the memory device has been patterned as shown in FIG. 1. In particular, FIG. 1 shows a semiconductor structure 100 comprising one or more patterned memory devices 102, 104. The patterned memory device(s) 102, 104 may be a magnetic tunnel junction (MTJ)

device, a phase change memory (PCM) device, or any other type of memory device capable of being embedded/integrated on-chip.

In one example, the semiconductor structure 100 further includes a metallization material stack that includes one or more metallization layers 106, 108. A first metallization layer 106 (which may also be referred to as a bottom metallization layer) may be disposed directly on a semiconductor stack. The first metallization layer 106 may be comprised of one or more layers including a first layer 110, a second layer 112, a third layer 114, etc. The first layer 110 may comprise an oxide, moderate-k dielectric, and/or the like. The second layer 112 may be disposed on and in contact with the first layer 110 and may comprise a capping material such as silicon carbide, hydrogen and nitrogen doped silicon carbide, silicon nitride, and/or the like. The third layer 114 may be disposed on and in contract with the second layer 112 and comprise an insulating material such as a low-k dielectric, ultra-low-k dielectric, and/or the like. It should be noted that embodiments are not limited to the layers of the first metallization layer 106 shown in FIG. 1 as additional layers may be added and/or one or more layers may be removed.

The first metallization layer 106 may comprise patterned metal layers 116, 118 embedded therein. In the example shown in FIG. 1, the patterned metal layers 116, 118 are embedded within the first layer 110, second layer 112, and third layer 114 of the first metallization layer 106. The patterned metal layers 116, 118 in one example, are metallization contacts comprising, tungsten, copper, cobalt, and/or the like. The second metallization layer 108 (which in certain embodiments may also be referred to as a top metallization layer) may be disposed on the first metallization layer 106. In one example, the second metallization layer 108 comprises silicon carbide, hydrogen and nitrogen doped silicon carbide, silicon nitride, and/or the like. It should be noted that while the metallization material stack may include the second metallization layer 108 disposed directly on the first metallization layer 106, in various embodiments the metallization material stack may include one or more intervening metallization layers between the first and second metallization layers 106, 108. That is, the second metallization layer 108 would be disposed on one or more intervening metallization layers, or other material layers, which would be disposed on the first metallization layer 106.

In some examples, a dielectric insulating layer (not shown) may separate the second metallization layer 108 from the first metallization layer 106. This dielectric insulating layer may be used to separate at least some metal wiring, circuits, and junctions, in the second metallization layer 108 from making direct electrical contact with metal wiring, circuits, and junctions, in the first metallization layer 106. The dielectric insulating layer may be removed at selected locations to allow electrical interconnection, e.g., wiring and junctions, to extend from the second metallization layer 108 down to the first metallization layer 106, and/or further below to a semiconductor stack (not shown). The dielectric insulating layer may include, for example, dielectric material such as silicon oxide or carbon-doped oxide, or other low K dielectrics.

In one example, the second metallization layer 108 comprises one or more electrodes 120, 122 (also referred to herein as "bottom electrodes 120, 122"). In this example, the top surface of the bottom electrode 120, 122 is planar with a top surface of the second metallization layer 108 and a bottom surface of the electrode 120, 122 contacts a top surface of the pattern metal layer 116, 118. The bottom electrode 120, 122 may comprise copper, titanium nitride (TiN), tantalum nitride (TaN), tungsten (W), and/or the like. The memory device 102, 104 may be formed on and in contact with the bottom electrode 120, 122. In some instances the memory device 102, 104 may also be formed in contact with the second metallization layer 108. One or more electrodes 124, 126 (also referred to herein as "top electrodes 124, 126") may be formed on and in contact with the memory device 102, 104. The top electrode 124, 126 may comprise tantalum nitride (TaN), tungsten (W), tantalum (Ta), aluminum (Al), hafnium (Hf), titanium nitride (TiN), copper (Cu), cobalt (Co), and/or the like. Generally, these top electrode materials are sensitive to post processing (e.g., susceptible to dry or wet etch damage and forms resistive metal oxide)

Figure 2:
FIG. 2 is a cross-sectional view of the semiconductor device structure after an insulating layer has been formed according to one embodiment of the present invention.
Figure 2:
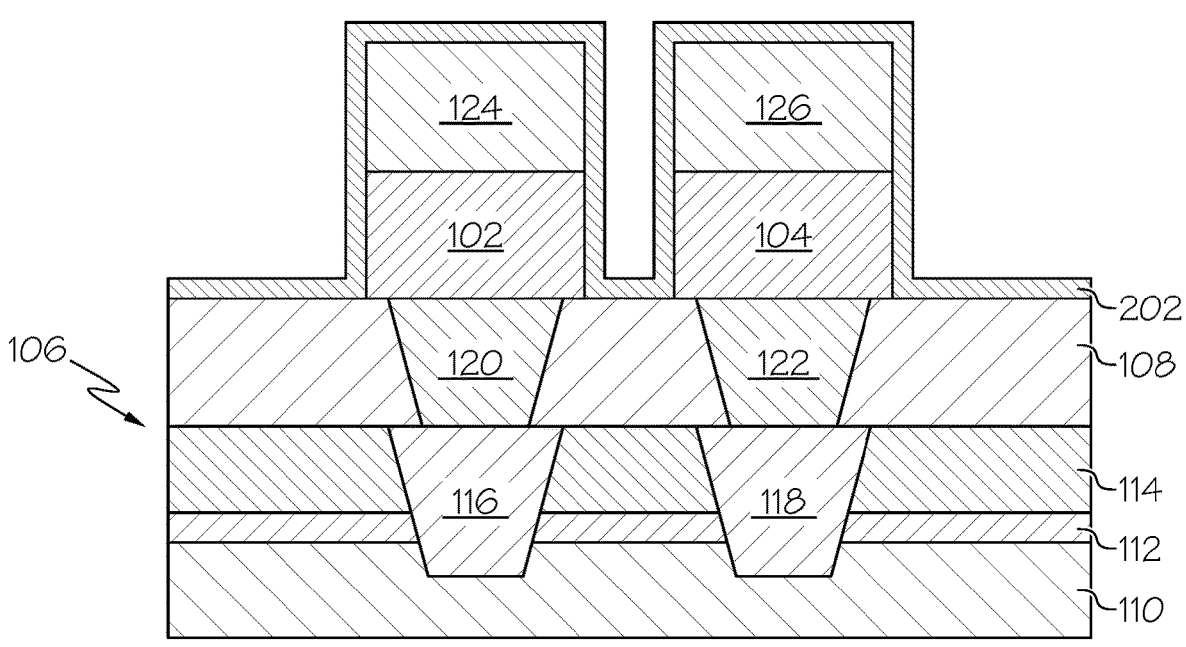

FIG. 2 shows that after the structure 100 of FIG. 1 has been formed, the exposed structures of the device are encapsulated. For example, an encapsulation layer 202 may be formed by depositing a dielectric material such as a silicon oxide, silicon nitride, silicon carbide and/or the like over and in contact with the top surface of the second metallization layer 108; sidewalls of the memory device 102, 104; sidewalls of the top electrode 124, 126; and the top surface of the top electrode 124, 126. The dielectric layer may be deposited using a passivation layer deposition process such as chemical vapor deposition (CVD), Plasma enhanced CVD (PECVD) and/or any other applicable process. The encapsulation layer 202 protects the memory device from degradation due to exposure to ambient oxygen and moisture as well as from any damages during later processing operations.

Figure 3:
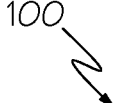
FIG. 3 is a cross-sectional view of the semiconductor device structure after the insulating layer has been etched back according to one embodiment of the present invention.
Figure 3:
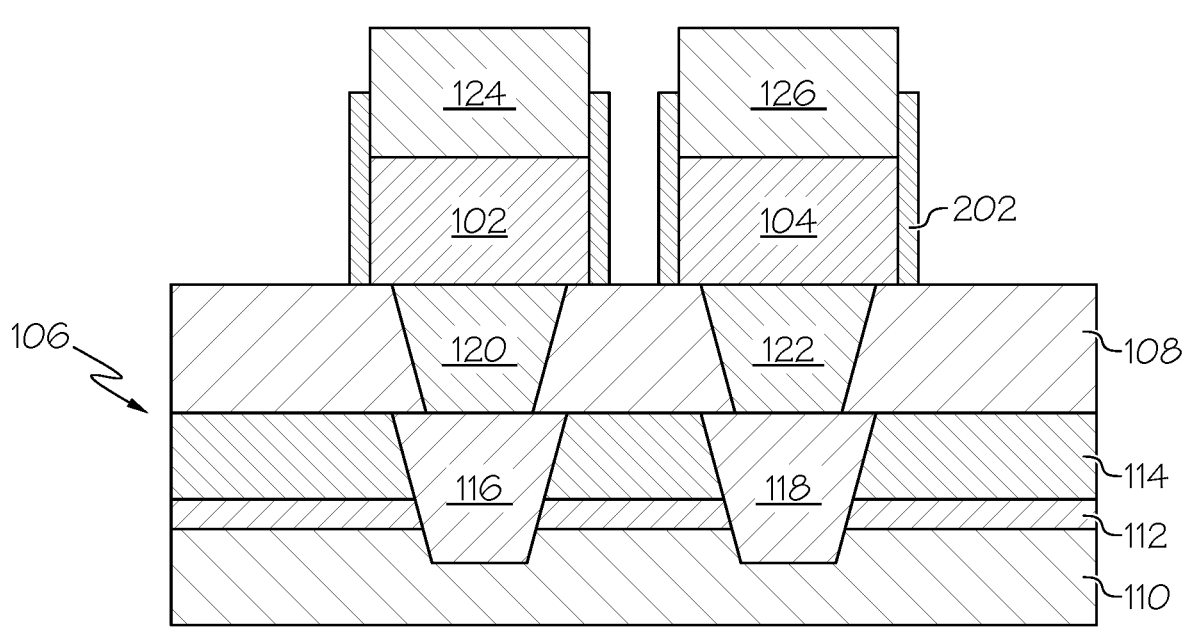
Figure 4:
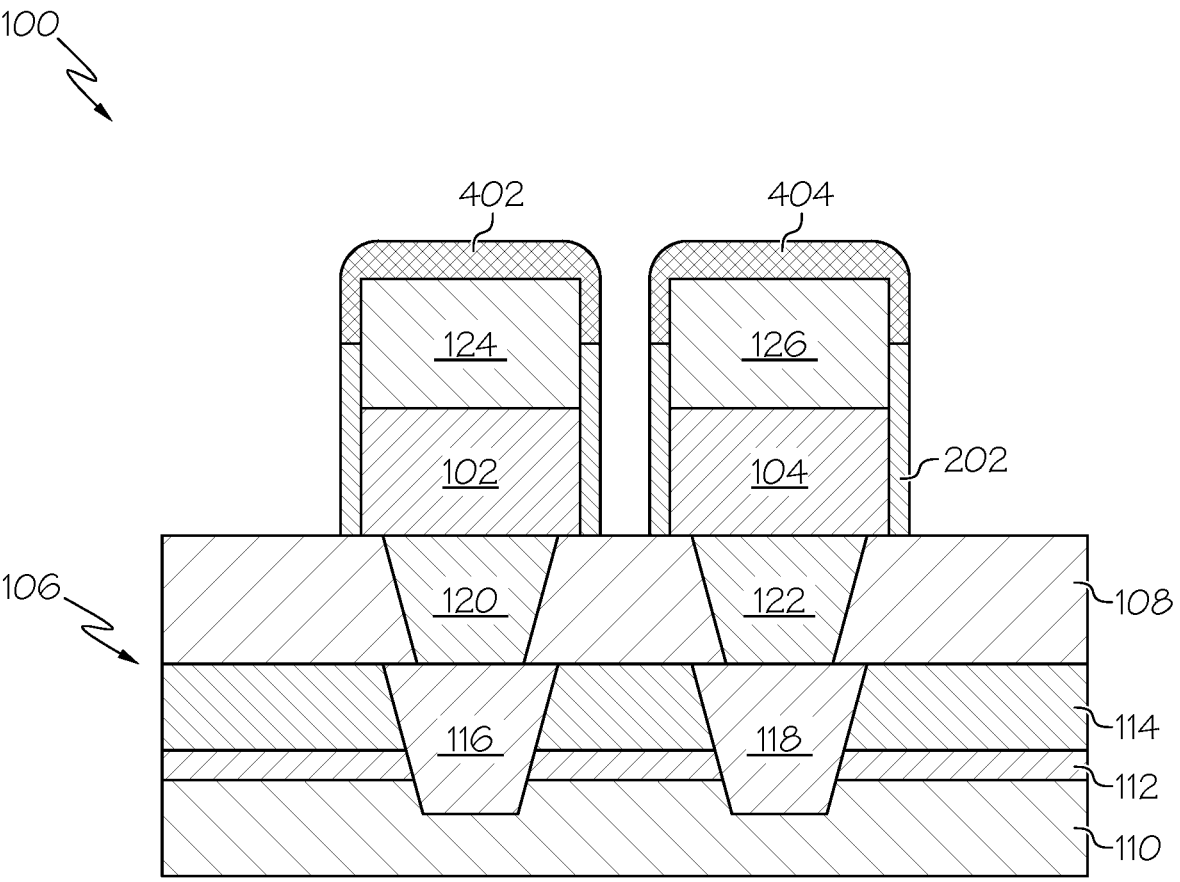
FIG. 4 is a cross-sectional view of the semiconductor device structure after a metal encapsulation layer has been formed in contact with exposed portions of a top electrode contacting the memory device according to one embodiment of the present invention.
Figure 5:
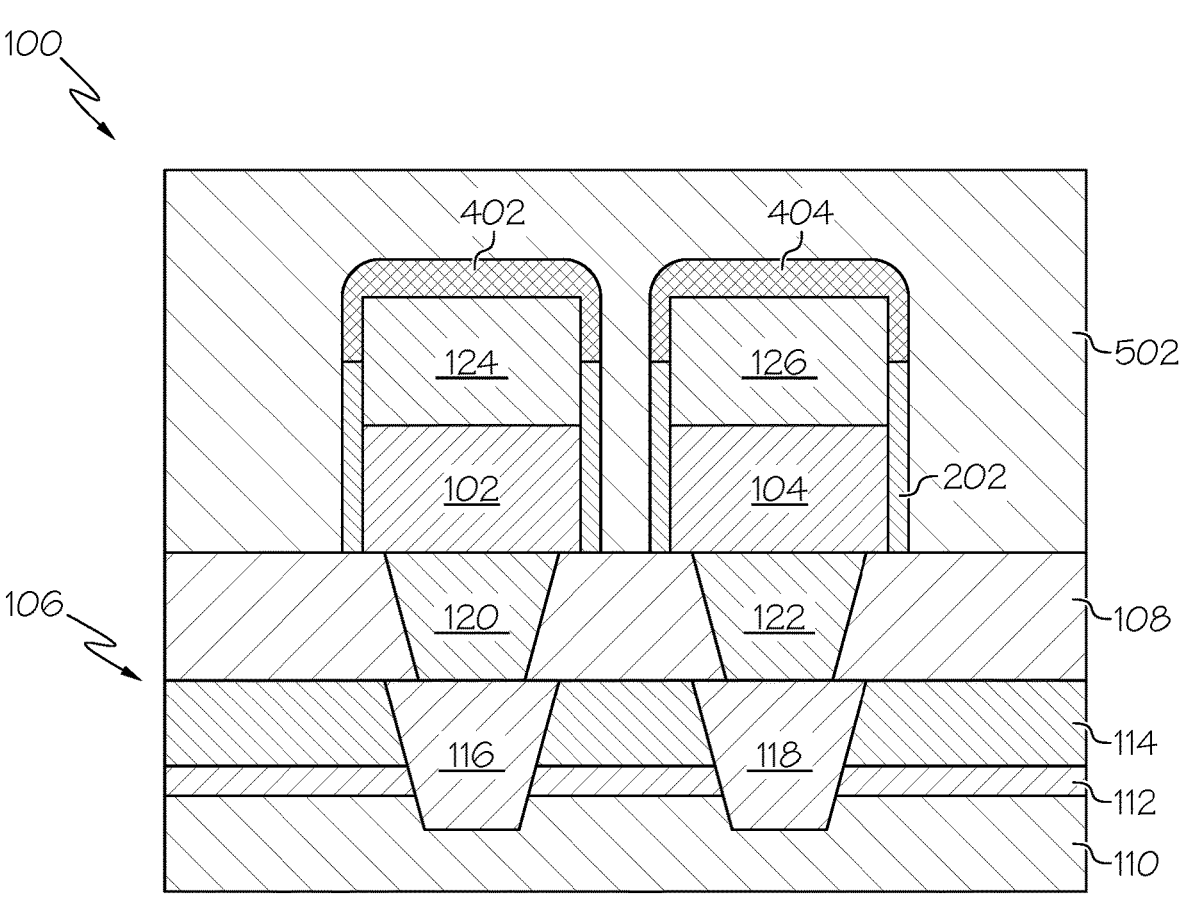
FIG. 5 is a cross-sectional view of the semiconductor device structure after an inter-layer dielectric has been formed according to one embodiment of the present invention.

After the encapsulation layer 202 has been formed it is etched back as shown in FIG. 3. For example, an etching process such as reactive ion etching (RIE) may be used to remove portions of the encapsulation layer 202 from the top surface of the second metallization layer 108; the top surface of the top electrode 124, 126; and a portion of the sidewalls of the top electrode 124, 126. FIG. 4 shows that a metal encapsulation layer 402, 404 is then formed over and in contact with the exposed sidewalls of the top electrode 124, 126; the top surface of the top electrode 124, 126; and a top surface of the dielectric encapsulation layer 202.

In one example, the metal encapsulation layer 402, 404 may be selectively formed using atomic layer deposition and/or other applicable processes where the metal growth is selective to dielectric encapsulation layer 202. The selectivity of the metal growth is enhanced by precursor adhesion to the top electrode 124 due to the surface energy difference compared to the surrounding dielectric materials. The deactivation of the insulating materials through, for example, grafted organic materials on the insulator surfaces may also be used to improve the selectivity. The organic deactivation layers may be designed with chemical functionality that selectively graft to the dielectric surfaces but not to exposed metal areas.

The metal encapsulation layer 402, 404 may be comprised of a single layer or multiple layers of metals such as ruthenium (Ru), iridium (Jr), other noble metals, chromium (Cr), and/or other materials that are chemical etch resistant and have a highly conducting oxide. One advantage of the metal encapsulation layer 402, 404 is that it prevents the top electrode from becoming eroded or damaged while embedding the memory device in the backend. Another advantage is that the encapsulation layer 402, 404 chemical etch resistant and forms a highly conductive oxide when exposed to ambient or oxygen containing plasma that allows the top electrode to maintain desired electrical contact resistance properties.

After formation of the metal encapsulation layer 402, 404, an inter-layer dielectric (ILD) layer 502 may be formed over the entire structure, as shown in FIG. 4. The ILD layer 502 may be formed using a deposition method, such as chemical vapor deposition (CVD), e.g., plasma enhanced chemical vapor deposition (PECVD), deposition from chemical solution, or spin on deposition.

Figure 6:
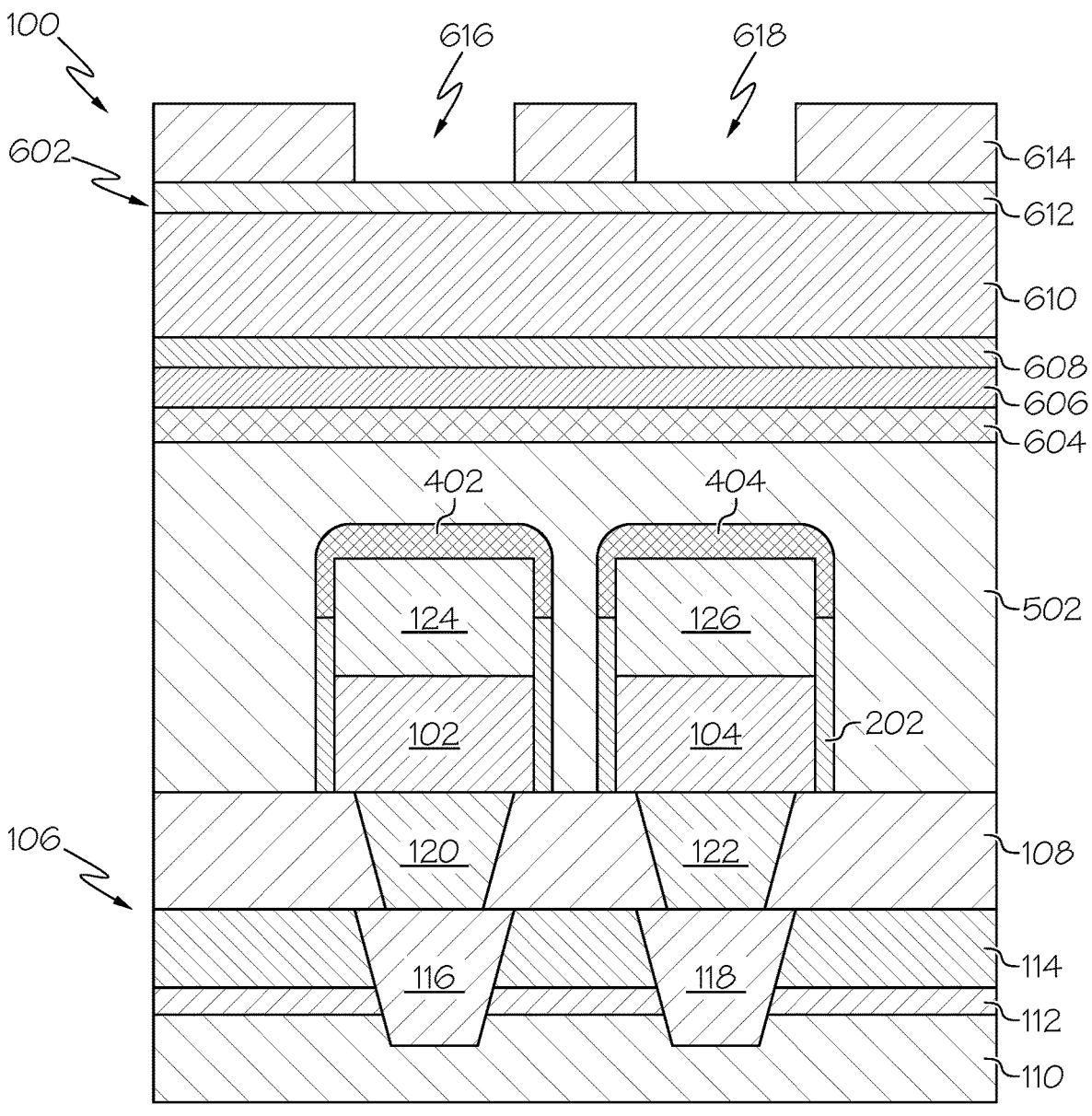
FIG. 6 is a cross-sectional view of the semiconductor device structure after a patterning stack has been formed according to one embodiment of the present invention.

FIG. 6 shows that a top interconnect patterning stack 602 may then be formed on and in contact with the ID 502. In the example shown in FIG. 6 the stack 602 comprises multiple hardmask layers 604, 606, 608 such as sacrificial nitride, titanium nitride, oxide, and/or the like. The stack 602 may also comprise a tri-layer or quad layer lithography stacks. For example, FIG. 6 shows that the stack 602 comprises an organic planarization layer (OPL) 610, an anti-reflective coating (ARC) 612, and a photoresist layer 614. The OPL 610 may include a material(s) such as spin-on carbon (SOC), diamond-like carbon, polyarylene ether, polyimide, polymethyl methacrylate, polymethylisopropenyl ketone, photoresists, and/or the like. The OPL 610 may be formed utilizing any conventional deposition process including, for example, CVD, PVD, plasma enhanced chemical vapor deposition (PECVD), evaporation, spin coating, and dip coating. Chemical mechanical planarization (CMP) and/or grinding may be used to planarize the deposited OPL.

The ARC layer 612 may comprise a silicon-ARC, titanium-ARC, and/or the like. The ARC layer 612 may be formed by, for example, one or more processes including sputtering, evaporation, CVD, PVD, ALD, and/or the like. The photoresist layer 614 may comprise a material that is sensitive to one or more types of radiation such as extreme ultraviolet (EUV) light, ultraviolet light, electron beam, X-ray, and/or the like. The photoresist layer 614 may be deposited using one or more processes such as CVD, PVD, ALD, and/or the like.

The photoresist layer 614 may be patterned using any suitable photolithography technique. For example, in on embodiment, a photomask is disposed over the photoresist layer. The photoresist layer may then be exposed to a radiation beam, and then hardened via a curing or baking process. Unexposed or exposed portions of the photoresist layer may then be removed using a developer. The foregoing process results in the desired pattern. The pattern includes portions of the photoresist layer 614 in contact with ARC layer 612 with openings 616, 618 between these portions exposing the ARC layer 612. In some embodiments, the portions of the photoresist layer 614 may be trimmed using, for example, an anisotropic plasma etch process.

Figure 7:
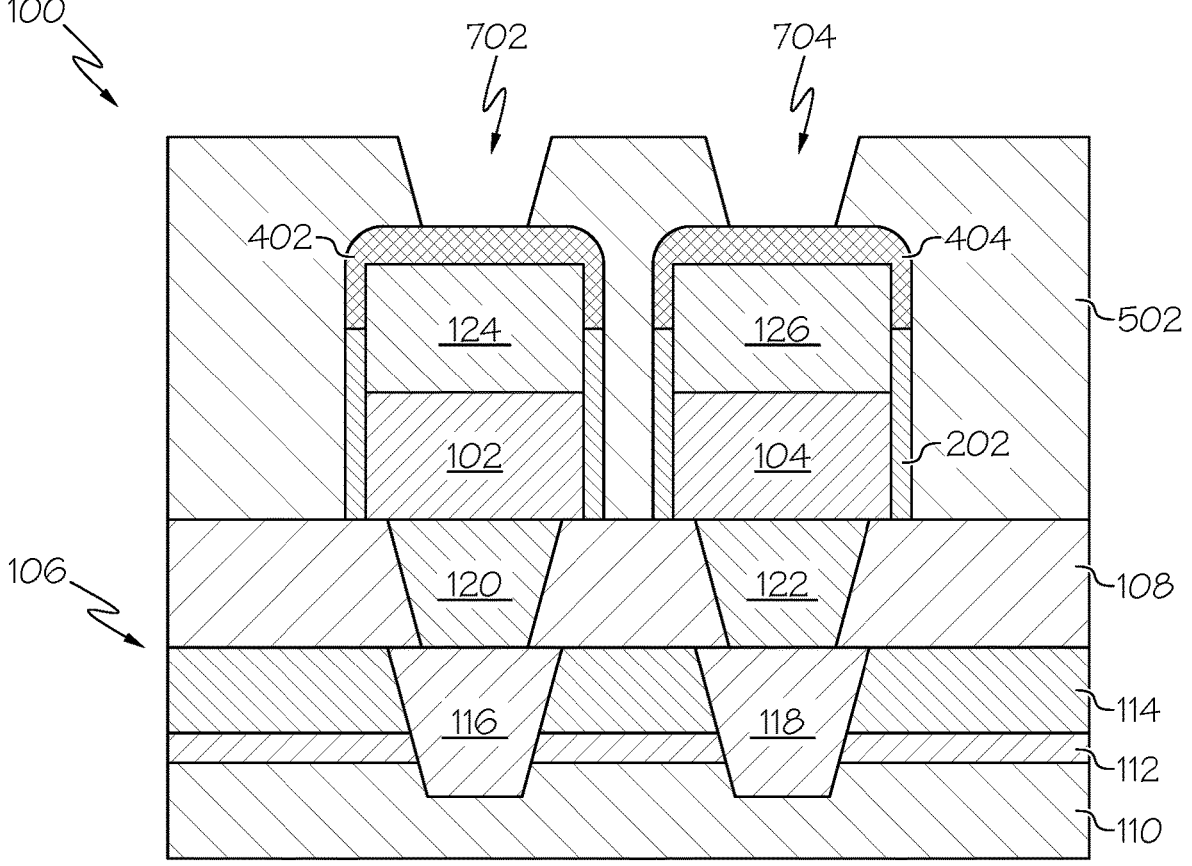
FIG. 7 is a cross-sectional view of the semiconductor device structure after contact trenches have been formed in the inter-layer dielectric using the patterning stack according to one embodiment of the present invention.

After the photoresist layer 612 has been patterned, the pattern is transferred down to the ILD 502, as shown in FIG. 7. For example, a selective etching process may be used to first transfer the pattern to the ARC layer 612. A separate selective etching process may then be used to transfer the pattern to the OPL 610. Alternatively, the ARC layer 612 and the OPL 610 may be etched using a single etching process. One or more etching processes may then be used to transferring the pattern down to each hardmask layer 604 to 608 and then down to the ILD 502. Remaining photoresist layer 614, the ARC layer 612, and the OPL 610 may be removed by, for example, reactive ion etch (RIE). The remaining hard masks 608 to 610 may also be removed using one or more RIE processes, wet process and/or chemical mechanical polish (CMP).

Figure 8:
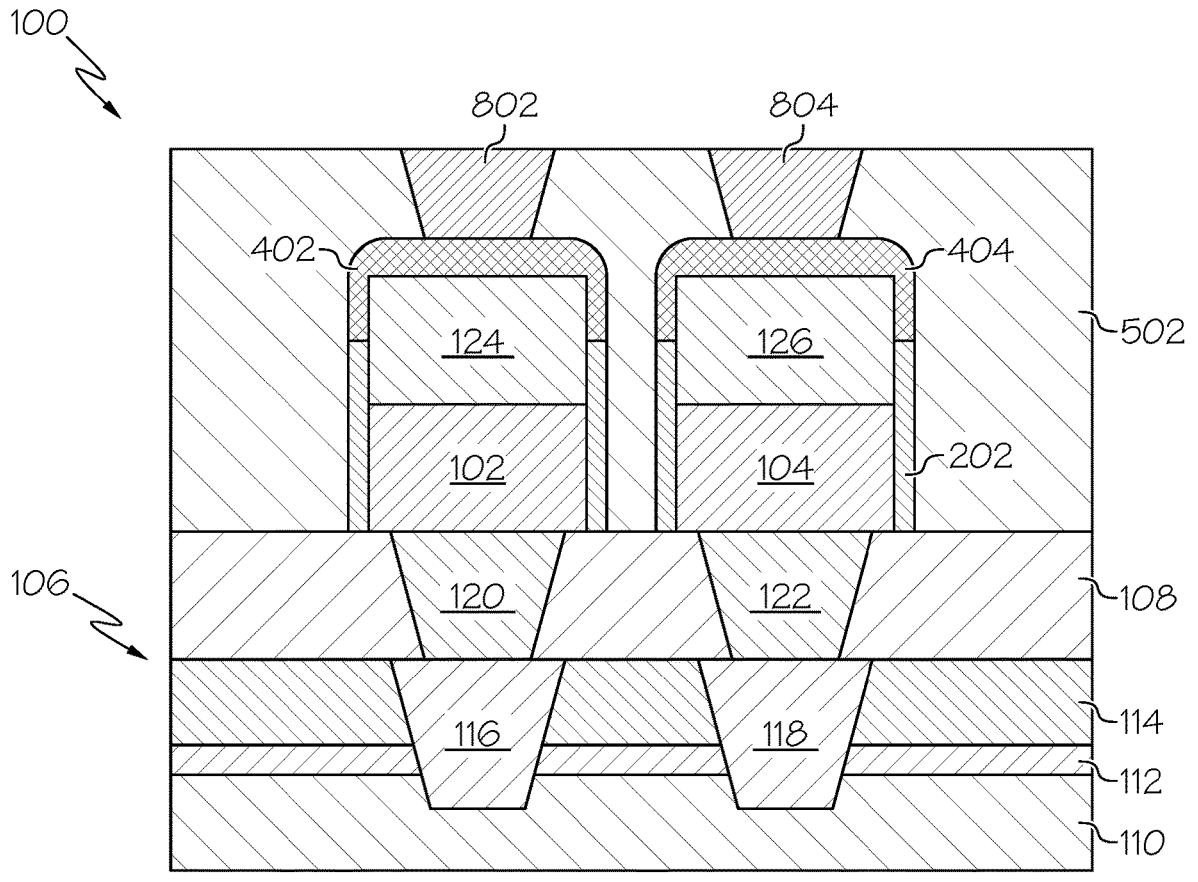
FIG. 8 is a cross-sectional view of the semiconductor device structure after one or more contacts have been formed according to one embodiment of the present invention.

The patterning process forms one or more trenches 702, 704 for an interconnect(s) within the ILD 502. The trench 702, 704 exposes at least a portion of the top surface of the metal encapsulation layer 402, 404. The etch resistant metal encapsulation layer 402, 404 protects the top electrode 124, 126 during the patterning processes, mask removal processes, and other subsequent processes. FIG. 8 shows that a metal fill process may then be performed to fill the trenches 702, 704 to form one or more interconnects/contacts 802, 804. For example, a copper seed may be deposited via PVD followed by copper plating, though chemical vapor deposition (CVD) techniques could be used as well. However, other materials and processes may be utilized to form the interconnect/contact 802, 804. For example, copper, cobalt, tungsten, aluminum, a combination thereof, and other the like may be used to fill the trenches 702, 704. The metal may be planarized such that the top surface of the interconnects/contacts 802, 804 is planar with the top surface of the ILD 502.

Figure 9:
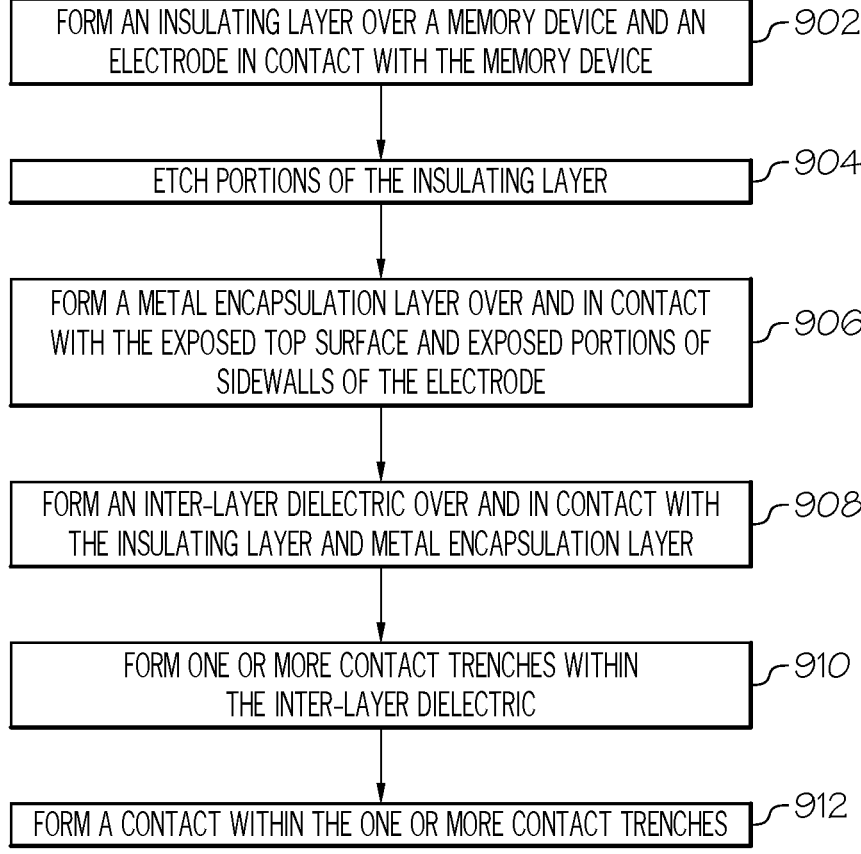
FIG. 9 is an operational flow diagram illustrating one example of a process for encapsulating electrodes of memory devices according to one embodiment of the present invention.

FIG. 9 is an operational flow diagram illustrating one example of a process for encapsulating electrodes of memory devices. It should be noted that each of the steps shown in FIG. 9 has been discussed in greater detail above with respect to FIGS. 1 to 8. An insulating layer, at step 902, is formed over a memory device and an electrode in contact with the memory device. Portions of the insulating layer, at step 904, are etched. The etching exposes a top surface and a portion of sidewalls of the electrode. A metal encapsulation layer, at step 906, is formed over and in contact with the top surface and the portion of sidewalls of the electrode. An inter-layer dielectric, at step 908, is formed over and in contact with the insulating layer and metal encapsulation layer. One or more contact trenches, at step 910, are formed within the inter-layer dielectric. The one or more contact trenches expose at least a portion of the metal encapsulation layer. A contact, at step 912, is formed within the one or more contact trenches.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A semiconductor device structure comprising at least:
an embedded memory device;
an electrode in contact with a top surface of the memory embedded device; and
a metal encapsulation layer in contact with a top surface of the electrode and a portion of sidewalls of the electrode, wherein the metal encapsulation layer comprises one or more materials that are chemical etch resistant and are conductive when oxidized.

2. The semiconductor device structure of claim 1, further comprising:
an insulating layer in contact with sidewalls of the embedded memory device and a second portion of sidewalls of the electrode.

3. The semiconductor device structure of claim 1, further comprising:
at least one contact formed on the metal encapsulation layer.

4. The semiconductor device structure of claim 3, wherein the at least one contact is formed within an inter-layer dielectric.

5. The semiconductor device structure of claim 1, further comprising:
an additional electrode formed in contact with a bottom surface of the embedded memory device.

6. The semiconductor device structure of claim 5, wherein the additional electrode is further formed in contact with one or more metallization layers.

7. An integrated circuit comprising:
an embedded memory device;
an electrode in contact with a top surface of the memory embedded device; and
a metal encapsulation layer in contact with a top surface of the electrode and a portion of sidewalls of the electrode, wherein the metal encapsulation layer comprises one or more materials that are chemical etch resistant and are conductive when oxidized.

8. The integrated circuit of claim 7, further comprising:
an insulating layer in contact with sidewalls of the embedded memory device and a second portion of sidewalls of the electrode.

9. The integrated circuit of claim 7, further comprising:
at least one contact formed on the metal encapsulation layer.

10. The integrated circuit of claim 9, wherein the at least one contact is formed within an inter-layer dielectric.

11. The integrated circuit of claim 7, further comprising:
an additional electrode formed in contact with a bottom surface of the embedded memory device.

12. The integrated circuit of claim 11, wherein the additional electrode is further formed in contact with one or more metallization layers.

13. A semiconductor device structure comprising at least:
an embedded memory device;
an electrode in contact with a top surface of the memory embedded device;
an insulating layer; and
a metal encapsulation layer in contact with a top-most surface of the electrode and a portion of sidewalls of the electrode, wherein sidewalls of the metal encapsulation layer and sidewalls of the insulating layer are coplanar, and wherein the metal encapsulation layer comprises one or more materials that are chemical etch resistant and are conductive when oxidized.

14. The semiconductor device structure of claim 13, further comprising: at least one contact formed on the metal encapsulation layer.

15. The semiconductor device structure of claim 14, wherein the at least one contact is formed within an inter-layer dielectric.

16. The semiconductor device structure of claim 13, further comprising:
an additional electrode formed in contact with a bottom surface of the embedded memory device.

17. The semiconductor device structure of claim 16, wherein the additional electrode is further formed in contact with one or more metallization layers.

\* \* \* \* \*